United States Patent
Teggatz et al.

(10) Patent No.: US 9,515,651 B2
(45) Date of Patent: Dec. 6, 2016

(54) GALVANICALLY ISOLATED SWITCH SYSTEM

(71) Applicant: Triune IP LLC, Richardson, TX (US)

(72) Inventors: Ross E. Teggatz, McKinney, TX (US); Wayne T. Chen, Plano, TX (US)

(73) Assignee: TRIUNE IP LLC, Plano, TX (US)

( * ) Notice: Subject to any disclaimer, the term of this patent is extended or adjusted under 35 U.S.C. 154(b) by 0 days.

(21) Appl. No.: 14/309,708

(22) Filed: Jun. 19, 2014

(65) Prior Publication Data

US 2015/0372676 A1  Dec. 24, 2015

(51) Int. Cl.
 H03K 3/00    (2006.01)
 H03K 17/689  (2006.01)
 H03K 17/16   (2006.01)
 H03K 17/10   (2006.01)
 H03K 17/605  (2006.01)

(52) U.S. Cl.
 CPC .......... *H03K 17/689* (2013.01); *H03K 17/102* (2013.01); *H03K 17/162* (2013.01); *H03K 17/605* (2013.01); *H03J 2200/06* (2013.01); *H03K 2217/0054* (2013.01)

(58) Field of Classification Search
 CPC .................................................... H03K 17/689
 USPC .................................................. 327/108–112
 See application file for complete search history.

(56) References Cited

U.S. PATENT DOCUMENTS

| | | | |
|---|---|---|---|
| 4,493,092 A * | 1/1985 | Adams | H04L 25/4925 326/62 |
| 4,575,642 A | 3/1986 | Hochreutiner et al. | |
| 5,616,970 A | 4/1997 | Dittrich | |
| 5,654,677 A * | 8/1997 | Dent | H03K 3/354 331/108 A |
| 6,141,195 A * | 10/2000 | Buhring | H02H 11/005 340/660 |
| 8,710,903 B2 * | 4/2014 | Oraw | H02M 3/07 327/337 |
| 2005/0003771 A1 | 1/2005 | De Ruijter et al. | |
| 2011/0127849 A1 | 6/2011 | Yoon et al. | |
| 2013/0181785 A1 | 7/2013 | Morandini et al. | |
| 2014/0009248 A1 | 1/2014 | Granger-Jones | |

FOREIGN PATENT DOCUMENTS

| | | |
|---|---|---|
| EP | 2720375 A1 | 4/2014 |
| JP | 2012-124807 | 6/2012 |
| WO | 2013/065387 A1 | 5/2013 |

OTHER PUBLICATIONS

European Patent Office; International Search Report and Written Opinion; PCT Application No. PCT/US2015/034813; Aug. 26, 2015.

* cited by examiner

*Primary Examiner* — Kenneth B Wells

(74) *Attorney, Agent, or Firm* — Jackson Walker LLP; Christopher Rourk

(57) ABSTRACT

A galvanically isolated switch system and method comprising a plurality of switches having at least one terminal in series electrical connection, at least one control input electrically connected to at least one of the plurality of switches, wherein the at least one control input is isolated from direct current voltages and at least one passive component connected across the plurality of switches.

29 Claims, 11 Drawing Sheets

GALVANICALLY ISOLATED SWITCH SYSTEM

TECHNICAL FIELD

The disclosure relates to switch systems. More particularly, the disclosure relates to galvanically (DC voltage) isolated switch systems.

BACKGROUND

In resonant systems in which switches short out capacitors or other passives to tune the resonance, the voltage on the terminals relative to ground can be very large. High voltage field effect transistors can be utilized to implement these switches. High voltage field effect transistors typically include control blocks and level shifters. Implementations utilizing control blocks and level shifters are generally fairly complex and costly.

The disclosed system and method of a switching system allows the use of lower voltage transistors, allowing for a lower cost, higher performance system.

SUMMARY

There is provided according to one example and its aspect of the present disclosure of a galvanically isolated switch system comprising a plurality of switches having at least one terminal in series electrical connection, at least one control input electrically connected to at least one of the plurality of switches, wherein the at least one control input is isolated from direct current voltages and at least one passive component is connected across the plurality of switches.

BRIEF DESCRIPTION OF THE DRAWINGS

The present disclosure will be more clearly understood from consideration of the following detailed description and drawings in which.

References in the detailed description correspond to like references in the various drawings unless otherwise noted. Descriptive and directional terms utilized in the written description such as right, left, back, top, bottom, upper, side, et cetera, refer to the drawings themselves as laid out on the paper and not to physical limitations of the disclosure unless specifically noted. The drawings are not to scale, and some features of examples shown and discussed are simplified or amplified for illustrating principles and features as well as advantages of the disclosure.

DETAILED DESCRIPTION OF THE DISCLOSURE

The features and other details of the disclosure will now be more particularly described with reference to the accompanying drawings, in which various illustrative examples of the disclosed subject matter are shown and/or described. It will be understood that particular examples described herein are shown by way of illustration and not as limitations of the disclosure. The disclosed subject matter should not be construed as limited to any examples set forth herein. These examples are provided so that this disclosure will be thorough and complete, and will fully convey the scope of the disclosed subject matter to those skilled in the art. The principle features of this disclosure can be employed in various examples without departing from the scope of the disclosure. Patent applications and patents referenced herein are incorporated by reference.

The terminology used herein is for the purpose of describing particular examples and is not intended to be limiting of the disclosed subject matter. Like numbers refer to like elements throughout. As used herein the term "and/or" includes any and all combinations of one or more of the associated listed items. Also, as used herein, the singular forms "a", "an", and "the" are intended to include the plural forms as well, unless the context clearly indicates otherwise. It will be further understood that the terms "comprises", and/or "comprising" when used in this specification, specify the presence of stated features, integers, steps, operations, elements, and/or components, and do not preclude the presence or addition of one or more other features, integers, steps, operations, elements, components, and/or groups thereof. Also, as used herein, relational terms such as first and second, top and bottom, left and right, and the like may be used solely to distinguish one entity or action from another entity or action without necessarily requiring or implying any actual such relationship or order between such entities or actions.

Figure 1:
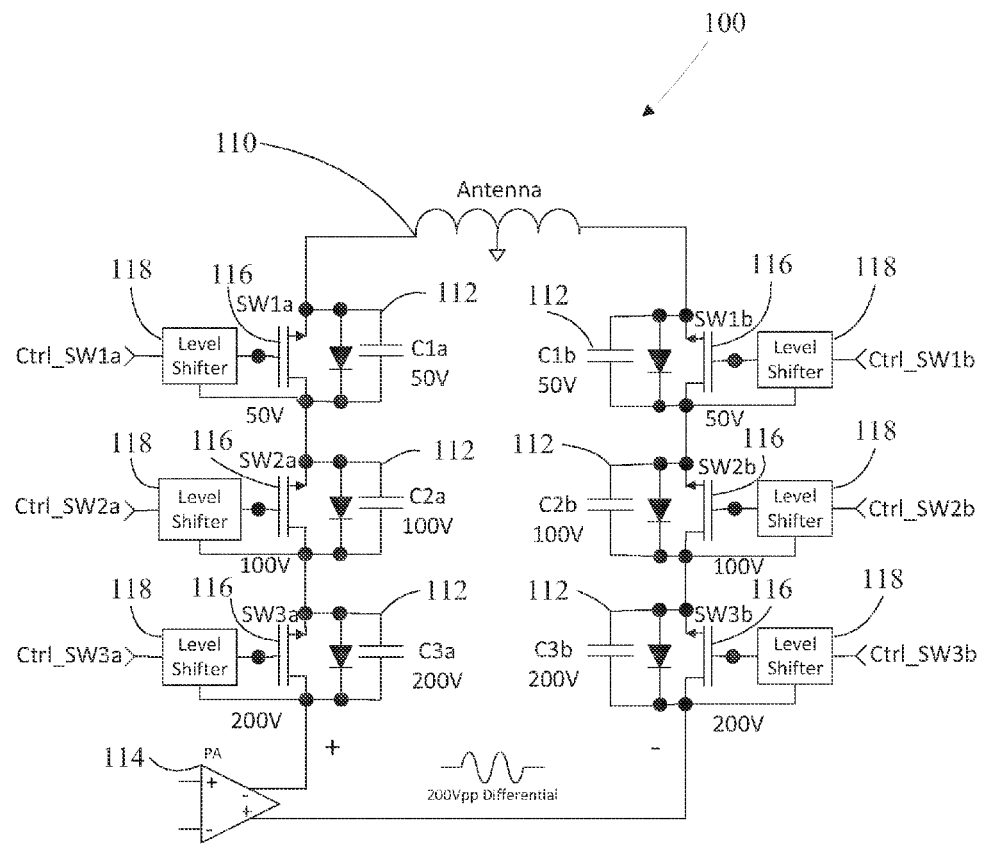
FIG. 1 show a prior art switch system.

FIG. 1 illustrates a system 100 of the prior art. The system is comprised of an antenna system, shown as an inductor 110, and multiple power capacitors 112 that are connected in series between the antenna and the power amplifier (PA) 114. Power switches 116 are placed in parallel with these power capacitors. Power switches are opened and closed to place and remove the effect of the power capacitors to tune the resonance of the system. Other configurations having switching control from another voltage potential may utilize this technique as well.

The switches in FIG. 1 are shown as FETs. In the prior art, the FETs typically support approximately the same voltage rating as the power capacitors. The FETs are typically driven by level shifters 118 having high voltage capabilities, the level shifters receiving feedback from the switches. The level shifters themselves are typically mated to high voltage components, thereby adding cost and complexity to the system.

Figure 2:
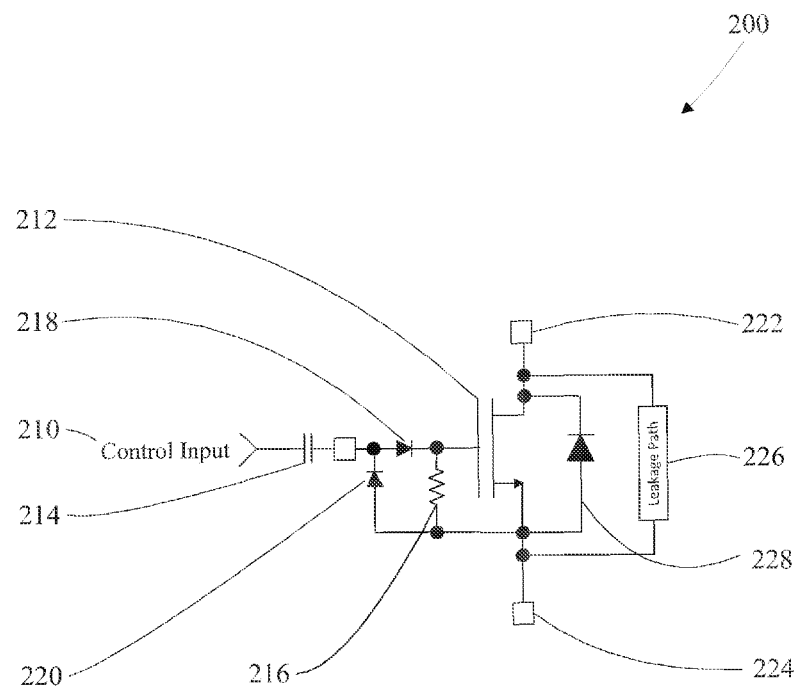
FIG. 2 shows an example of a galvanically isolated switch system.

FIG. 2 shows one possible system 200, in which a chip is DC isolated from the control signal and can float with the FET switches. The control signal 210 may be a clock signal in which the presence of a clock indicates that the switch 212 may be turned ON and the lack of a clock indicates that the switch may be turned OFF. The control signal may be fed into a capacitor 214 which acts as a bucket capacitor for a charge pump. As the control signal toggles, a voltage is created onto the gate of the FET, and turns on the FET thereby enabling the switch. To turn off the FET, the control signal is stopped, and the gate-source voltage of the FET goes to 0V through a bleed resistor 216. The bleeder circuit may be an active circuit, as opposed to the passive circuit of the present example. The control input signal to the switch gate may be rectified by diodes 218 and 220. The voltage inputs across the source and drain are designated by contacts 222 and 224. Across the switch are a leakage path 226 and a power diode 228. In this example the switches may be FETS, Bipolar switches, DPDT (Double Pole Double Throw) switches, MEMS switches and the like.

Figure 3:
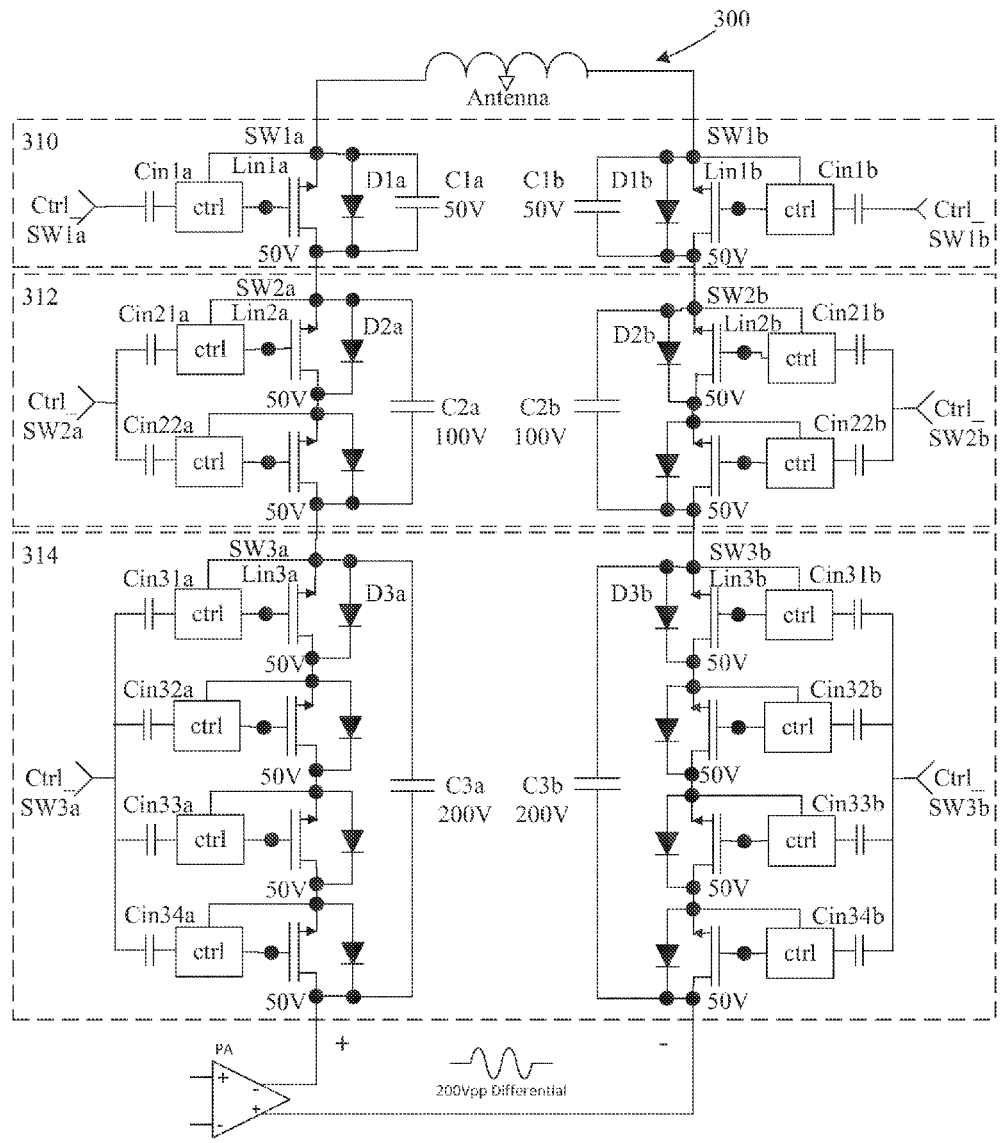
FIG. 3 shows an example of a galvanically isolated switch system based on MOSFET switches.

FIG. 3 shows a system 300 of several of the devices shown in FIG. 2 stacked in series to provide the breakdown voltage to support a capacitor. In one example, four 50V breakdown FETs are stacked in series to allow 200V breakdown operation when the four switches are off. The system is comprised of three blocks, a single level block, a double stack block and a quad-stack block. The single level block 310 contains a pair of opposite switches SW1 $a$ and SW1 $b$. The double level block 312 contains a pair of dual switches SW2 $a$ and SW2 $b$. The quad block 314 contains a pair of quad switches SW3 $a$ and SW3 $b$. The capacitor voltage values are matched to the stacked switch breakdown sum values. In the single level block SW1 $a$/SW1 $b$ having a breakdown of 50V is matched to a capacitor C1 $a$/C1 $b$ having a voltage rating of 50V. In the dual level block SW2 $a$/SW2 $b$ having a stacked breakdown of 2×50V=100V is matched to a capacitor C2 $a$/C2 $b$ having a voltage rating of 100V. In the quad level block SW3 $a$/SW3 $b$ having a stacked breakdown of 4×50V=200V is matched to a capacitor C3 $a$/C3 $b$ having a voltage rating of 100V. In the single level block the inputs Ctrl_SW1 $a$ is tied to input capacitor Cin1 $a$ and input $Ctrl_{13}$ SW1 $b$ is tied to input capacitors and Cin1 $b$. In the dual level block the input Ctrl_SW2 $a$ is tied to input capacitors Cin21 $a$/Cin22 $a$ and input Ctrl_SW2 $b$ is tied to input capacitors Cin21 $b$/Cin22 $b$. In the quad level block the input Ctrl_SW3 $a$ is tied to input capacitors Cin31 $a$/Cin32 $a$/Cin33 $a$/Cin34 $a$ and input Ctrl_SW3 $b$ is tied to input capacitors Cin31 $b$/Cin32 $b$/Cin33 $b$/Cin34 $b$. The blocks marked CTRL are control blocks having additional inputs Lin1$a$/Lin2$a$/Lin3$a$/Lin1$b$/Lin2$b$/Lin3$b$ tied to the source of their respective switch. A leakage path may provide voltage balancing when stacking multiple devices. Across the switch SW1 $a$ are capacitor C1 $a$ and diode D1 $a$, across switches SW2 $a$ are capacitor C2 $a$ and diodes D2 $a$ and across switches SW3 $a$ are capacitor C3 $a$ and diodes D3 $a$. Across the switch SW1 $b$ are capacitor C1 $b$ and diode D1 $b$, across switches SW2 $b$ are capacitor C2 $b$ and diodes D2 $b$ and across switches SW3 $b$ are capacitor C3 $b$ and diodes D3 $b$.

Figure 4:
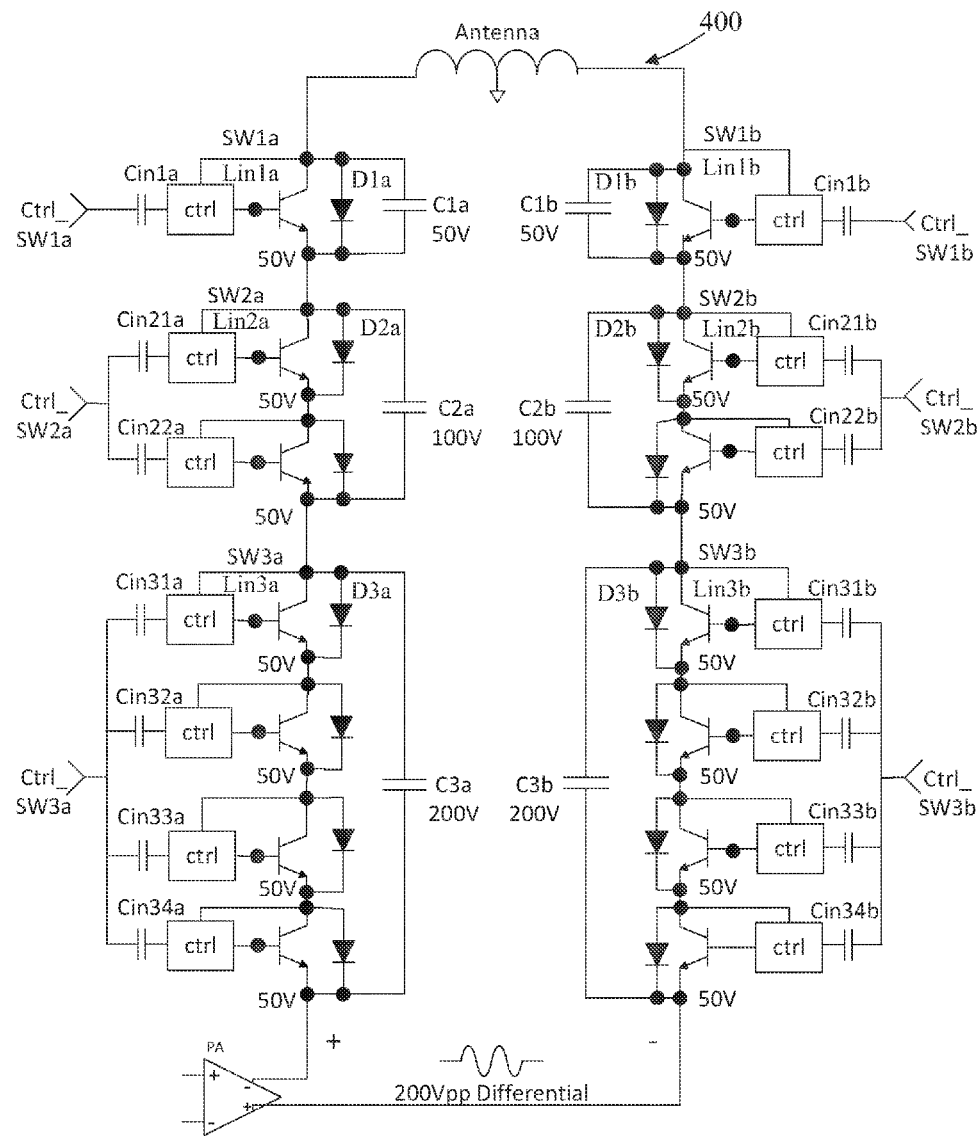
FIG. 4 shows an example of a galvanically isolated switch system based on BIPOLAR switches.

FIG. 4 shows a system 400 that is a modification of FIG. 3, in which the switches SW1$a$/SW1$b$, and switch blocks SW2$a$/SW2$b$ and SW3$a$/SW3$b$ are bipolar switches.

Figure 5:
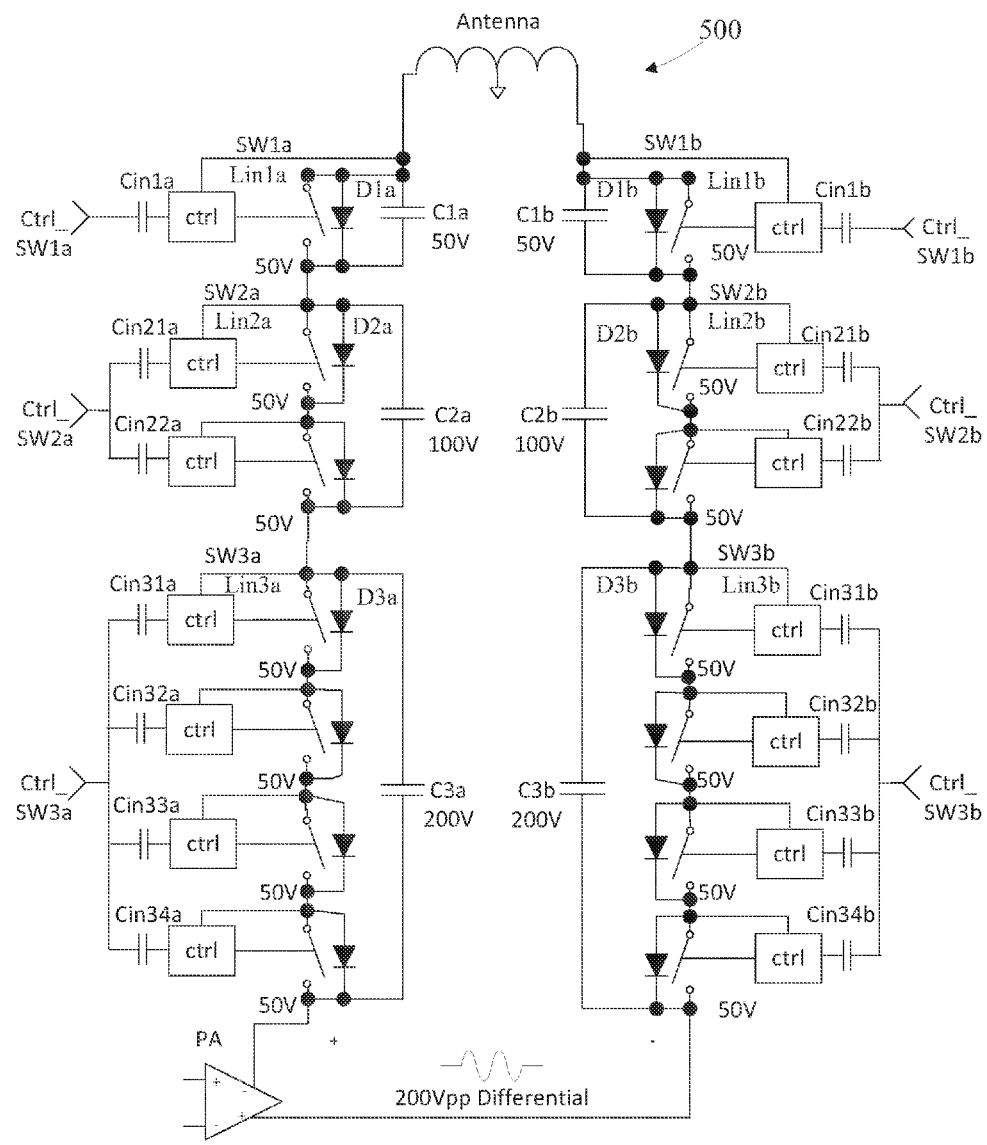
FIG. 5 shows an example of a galvanically isolated switch system based on MEMS switches.

FIG. 5 shows a system 500 that is a modification of FIG. 3, in which the switches SW1$a$/SW1$b$, and switch blocks SW2$a$/SW2$b$ and SW3$a$/SW3$b$ are microelectromechanical switches.

Figure 6:
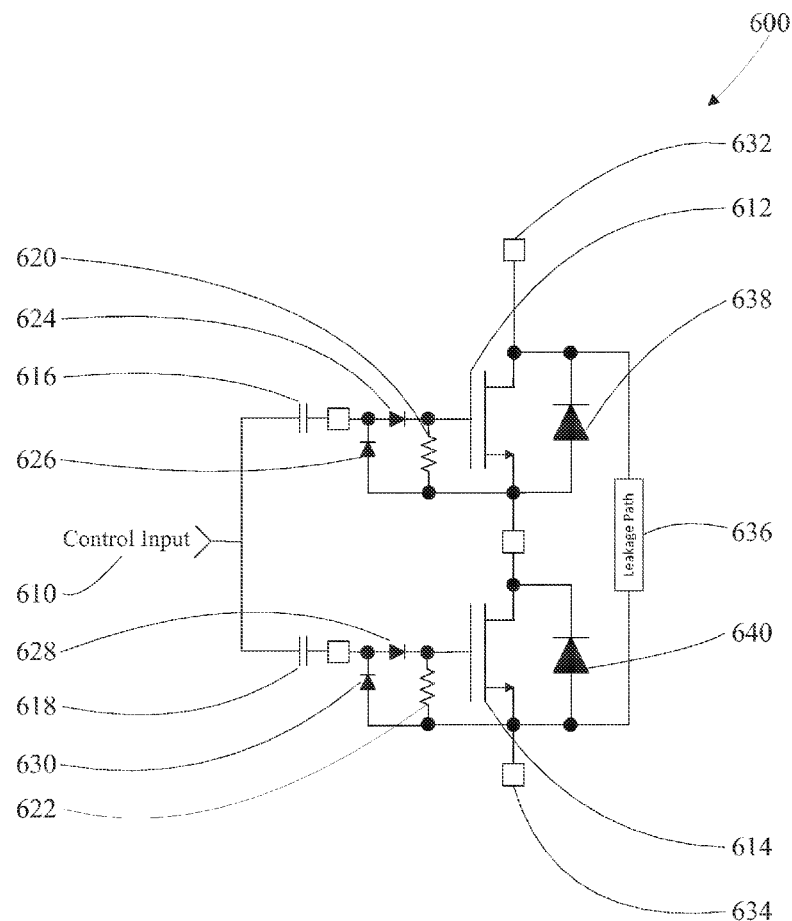
FIG. 6 shows an example of a galvanically isolated switch system based on MOSFET switches with a bleed resistor.

FIG. 6 shows another possible system 600, in which a chip is DC isolated from the control signal and can float with the FET switches. The control signal 610 may be a clock signal in which the presence of a clock indicates that the switches 612 and 614 may be turned ON and the lack of a clock indicates that the switch may be turned OFF. The control signal may be fed into capacitors 616 and 618 which act as a bucket capacitor for a charge pump. As the control signal toggles, a voltage is created onto the gate of the FET, and turns on the FET thereby enabling the switch. To turn off the FET, the control signal is stopped, and the gate-source voltage of the FET goes to 0V through bleed resistors 620 and 622. The bleeder circuit may be an active circuit, as opposed to the passive circuit of the present example. The control input signal to the switch gate may be rectified by diodes 624, 626, 628 and 630. The voltage inputs across the source and drain are designated by contacts 632 and 634. Across the switch are a leakage path 636 and power diodes 638 and 640. In this example the switches may be FETS, Bipolar switches, DPDT (Double Pole Double Throw) switches, MEMS switches and the like.

The bleeder circuit may comprise an active PMOS device connected from the gate to the source of the switch. Under the condition of no pumping, the gate would reside at ground potential. During a pumping condition, the CTRL pin of the gate may be charged up and the device turned to an OFF state. In the OFF state, the impedance of the PMOS bleeder device may be set to a low value. The effect would be that high frequency noise components on the source or drain would not allow the FET to be inadvertently turned ON.

Figure 7:
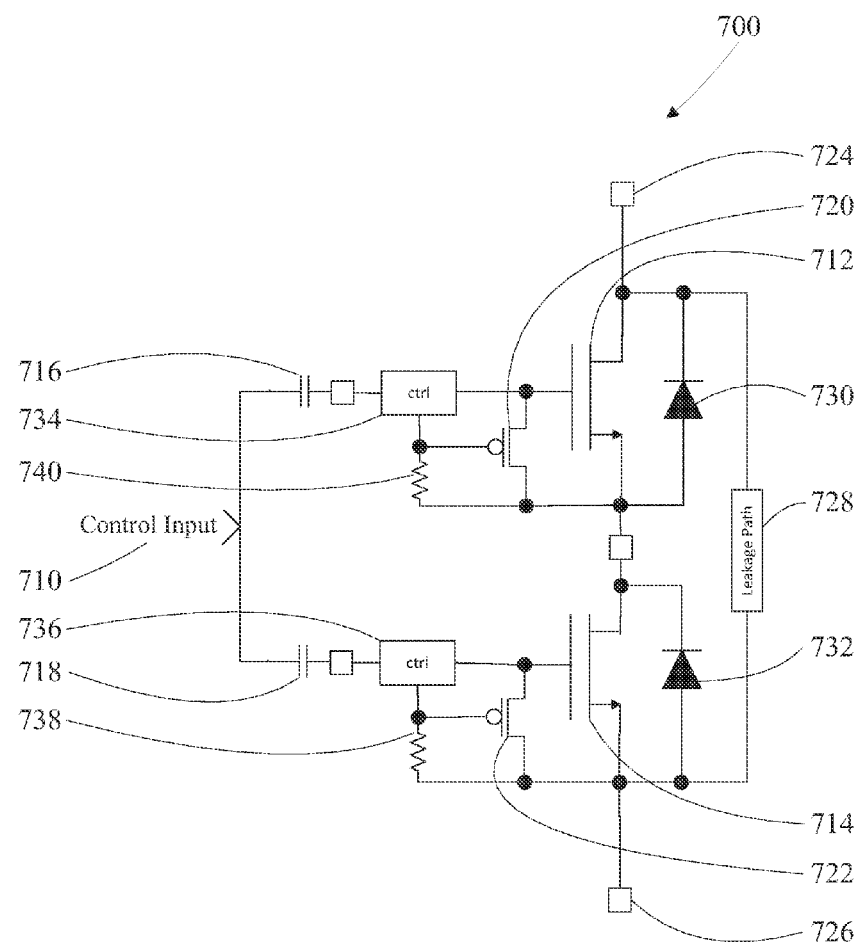
FIG. 7 shows an example of a galvanically isolated switch system based on MOSFET switches with a PMOS input transistor.

FIG. 7 shows another possible system 700, in which a chip is DC isolated from the control signal and can float with the FET switches. The control signal 710 may be a clock signal in which the presence of a clock indicates that the switches 712 and 714 may be turned ON and the lack of a clock indicates that the switch may be turned OFF. The control signal may be fed into capacitors 716 and 718 which act as a bucket capacitor for a charge pump. As the control signal toggles, a voltage is created onto the gate of the FET, and turns on the FET thereby enabling the switch. The bleeder circuit may comprise active PMOS devices 720 and 722 connected from the gate to the source of the switch. Under the condition of no pumping, the gate would reside at ground potential. During a pumping condition, the CTRL pin of the gate may be charged up and the-device turned to an OFF state. In the OFF state, the impedance of the PMOS bleeder device may be set to a low value. The effect would be that high frequency noise components on the source or drain would not allow the FET to be inadvertently turned ON. The voltage inputs across the source and drain are designated by contacts 724 and 726. Across the switch are a leakage path 728 and power diodes 730 and 732. The control circuits CTRL 734 and 736 modulate the gate of the switches utilizing feedback from bleed resistors 738 and 740 connected to the input of the PMOS devices 720 and 722. In this example the switches may be PETS, Bipolar switches, DPDT (Double Pole Double Throw) switches, MEMS switches and the like.

The power capacitors may be discrete component or integrated into a chip. A power capacitor may be utilized for a group of switches, or more than one capacitor may be utilized between control devices to add information and/or power. The capacitor may be replaced with a magnetic coupled circuit, a resonant circuit, an RF circuit, an amplitude modulation circuit, a frequency modulation circuit, a Pulsed Shift Key (PSK) circuit, an On-Off Key (OOK) and the like may be utilized to provide data and/or power to the system.

Communication from the galvanically isolated switch may be added to report status and faults back to the system. Communication links may be wireless or wired via magnetic coupling, resonant, inductive magnetic, capacitive or resistive circuitry. More than one charge pump may be utilized within the control circuit to perform alternative control tasks such as communication back to the system controller or internally controlling the system from an alternative power source. Fault detection may be added to detect current limit faults, thermal faults, open faults and short faults.

Figure 8:
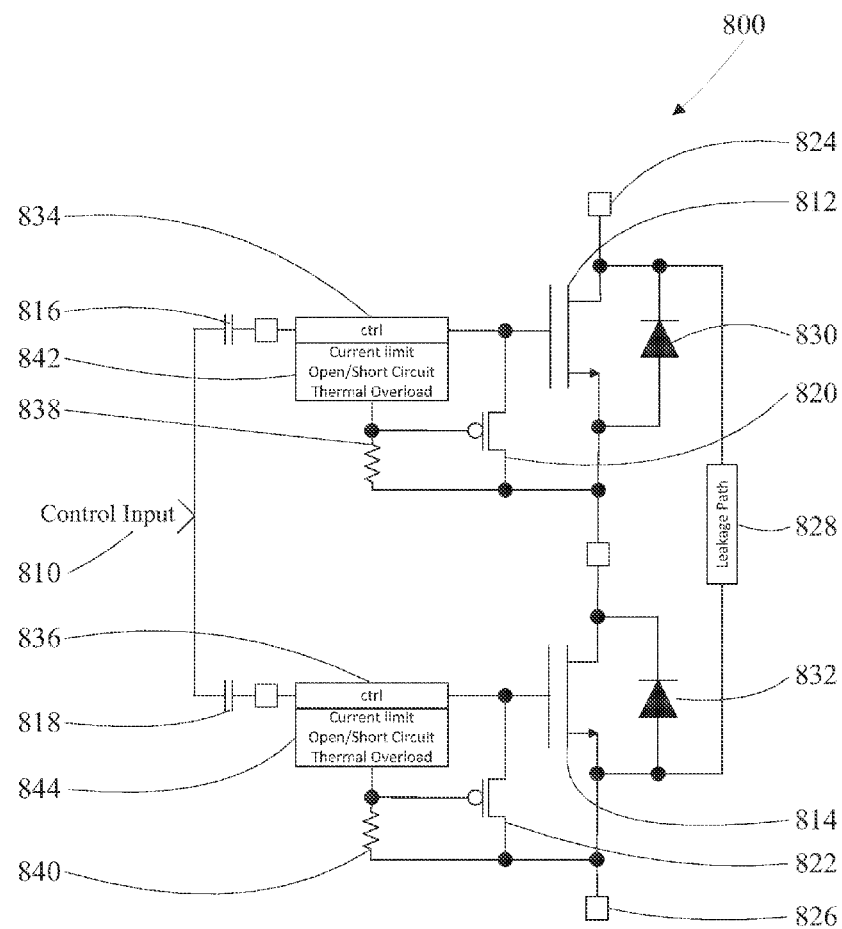
FIG. 8 shows an example of a galvanically isolated switch system based on Non-Volatile switches with a PMOS input transistor.

FIG. 8 shows another possible system 800, in which a chip is DC isolated from the control signal and can float with the FET switches. The control signal 810 may be a clock signal in which the presence of a clock indicates that the switches 812 and 814 may be turned ON and the lack of a clock indicates that the switch may be turned OFF. The control signal may be fed into capacitors 816 and 818 which act as a bucket capacitor for a charge pump. As the control signal toggles, a voltage is created onto the gate of the FET, and turns on the FET thereby enabling the switch. The bleeder circuit may comprise active PMOS devices 820 and 822 connected from the gate to the source of the switch. Under the condition of no pumping, the gate would reside at ground potential. During a pumping condition, the CTRL pin of the gate may be charged up and the device turned to an OFF state. In the OFF state, the impedance of the PMOS bleeder device may be set to a low value. The effect would be that high frequency noise components on the source or drain would not allow the FET to be inadvertently turned ON. The voltage inputs across the source and drain are designated by contacts 824 and 826. Across the switch are a leakage path 828 and power diodes 830 and 832. The control circuits CTRL 834 and 836 modulate the gate of the switches utilizing feedback from bleed resistors 838 and 840 connected to the input of the PMOS devices 820 and 822. In this example fault detection circuits 842 and 844 are connected to respective control circuits 834 and 836. The fault detection circuit may detect current limits, open circuits, short circuits, thermal overloads and the like. In this example the switches may be FETS, Bipolar switches, DPDT (Double Pole Double Throw) switches, MEMS switches and the like.

In the example depicted in FIG. 8, the control switch may communicate back to the system controller and give the health of a non-volatile bit. If the voltage is starting to lower, which would be an indication of a faulty bit, this information may be communicated to the controller and the system may send out a warning. In addition, the system may re-program the non-volatile bit to assure continued performance. Additional bits may be utilized to assure the robustness of the switch through redundancy. In this case schemes such as Hamming code or alternatively analog polling of floating gate may be utilized to assure robust performance. In this example may also comprise a current limit fault detector, an open circuit detector, short circuit detector and thermal fault detector.

One example to minimize component count would be to utilize two capacitors for the system. These two capacitors would charge the device and utilize a two wire communication link, such as Manchester encoding, to write to the control elements and turn on the appropriate switches. The identification of switches may either be hardwired internally or externally to the PCB system board, or switches may communicate back to the control pins and the system processor may determine which switches control which tuning capacitors or alternative loading configurations, or the control pin may sense the voltages/currents or other parametric values to determine where it is in the circuitry and either independently/handshake back to the controller its location in the system. In these cases either a volatile or non-volatile approach may be utilized to control the gates.

The FET control may also be configured with back to back FETS to inhibit current flow. Combination of the above examples may be utilized for control of power, control of data, switching methods, fault reporting, and system control.

A galvanically isolated switch system comprising, a plurality of switches having at least one terminal in series electrical connection, at least one control input electrically connected to at least one of the plurality of switches, wherein the at least one control input is isolated from direct current voltages, and at least one passive component connected across the plurality of switches.

The system may further comprise at least one bleed circuit electrically connected between the at least one control input and at least one terminal of at least one switch of the plurality of switches, at least one communication link circuit operatively coupled to at least one of the plurality of switches, at least one antenna responsive to at least one of the plurality of switches, and at least one input capacitor or at least one input transistor electrically connected to the control input. The at least one bleed circuit may comprise at least one bleed resistor or at least one bleed transistor.

The at least one communication link circuit operative coupling may comprise at least one of at least one wireless link and at least one wired link wherein the at least one wireless link may comprise at least one of at least one magnetic coupling, at least one resonant coupling, at least one capacitive coupling or at least one resistive coupling. The at least one of the plurality of switches may comprise at least one field effect transistor, at least one bipolar transistor, at least one microelectromechanical switch, at least one double pole double throw switch and at least one non-volatile memory switch.

The at least one passive component may comprise a leakage path, a power diode or a power capacitor. The at least one passive component may comprise at least one of at least one magnetically coupled circuit, at least one resonant circuit, at least one radio frequency circuit, at least one amplitude modulation circuit, at least one frequency modulation circuit, at least one pulsed shift key circuit and at least one on off key circuit. The system may comprise at least one fault detection circuit responsive to at least one of the plurality of switches and provide a fault signal wherein the fault detection circuit detects at least one a current limit fault, a thermal fault, an open fault or a short fault. The at least one of the plurality of switches may provide at least one power signal or at least one data signal.

Figure 9:
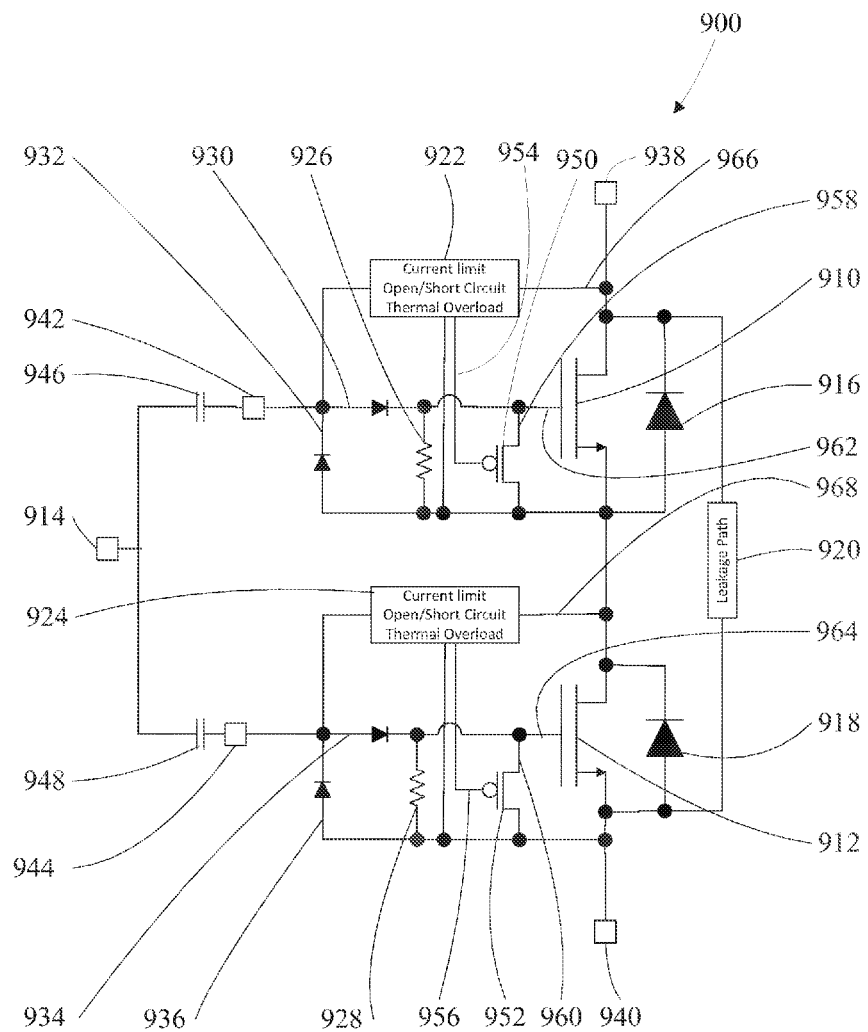
FIG. 9 shows an example of a galvanically isolated switch system based on MOSFET switches having interfaces to off chip components.

FIG. 9 shows a galvanically isolated switch system 900 in a single chip solution comprising, a plurality of switches 910 and 912 having at least one terminal in series electrical connection. The switches having at least one switch input, at least one control input interface electrically connected to at least one of the plurality of switches, wherein the at least one control input is isolated from direct current voltages. At least one control input interface 914 is electrically connected to at least one of the plurality of switches, wherein the at least one control input is isolated from direct current voltages. At least one passive component 916 and 918, that in this example are power diodes, are connected across the plurality of switches and a leakage path 920 is connected across the plurality of switches.

The system may further comprise at least one fault detection circuit 922 and 924, that may detect open circuits, short circuits, current limits and thermal overloads open fault detector responsive to at least one of the plurality of switches and providing a fault signal. The fault detection circuit may detect at least one a current limit fault, a thermal fault, an open fault and a short fault. The at least one of the plurality of switches may provide at least one power signal and the at least one of the plurality of switches provides at least one data signal.

FIG. 9 also shows to turn off the FET, the control signal is stopped, and the gate-source voltage of the FET goes to 0V through bleed resistors 926 and 928. The bleeder circuit may be an active circuit, as opposed to the passive circuit of the present example. The control input signal to the switch gate may be rectified by rectifier diodes 930, 932, 934 and 936. The voltage inputs across the source and drain are designated by contacts 938 and 940. At the input connections 942 and 944 are connected input capacitors 946 and 948. The fault detection circuit 922 and 924 modulate the gate of the switches utilizing feedback from bleed resistors 926 and 928 connected to the input of the PMOS devices 950 and 952.

The system also comprises at least one fault switch (PMOS devices 950 and 952) having at least one fault switch input 954 and 956 and at least one fault switch output 958 and 960. The at least one fault switch output electrically connected to the at least one switch input 962 and 964 and at least one fault detection circuit having at least one fault detection circuit input 966 and 968 electrically connected across the switch. At least one fault detection circuit output is electrically connected to the at least one fault switch input 954 and 956. The fault detection circuit detecting at least one of a current limit condition, an open circuit condition, a closed circuit condition and a thermal overload condition and the like. In this example the switches may be FETS, Bipolar switches, DPDT (Double Pole Double Throw) switches, MEMS switches and the like.

Figure 10:
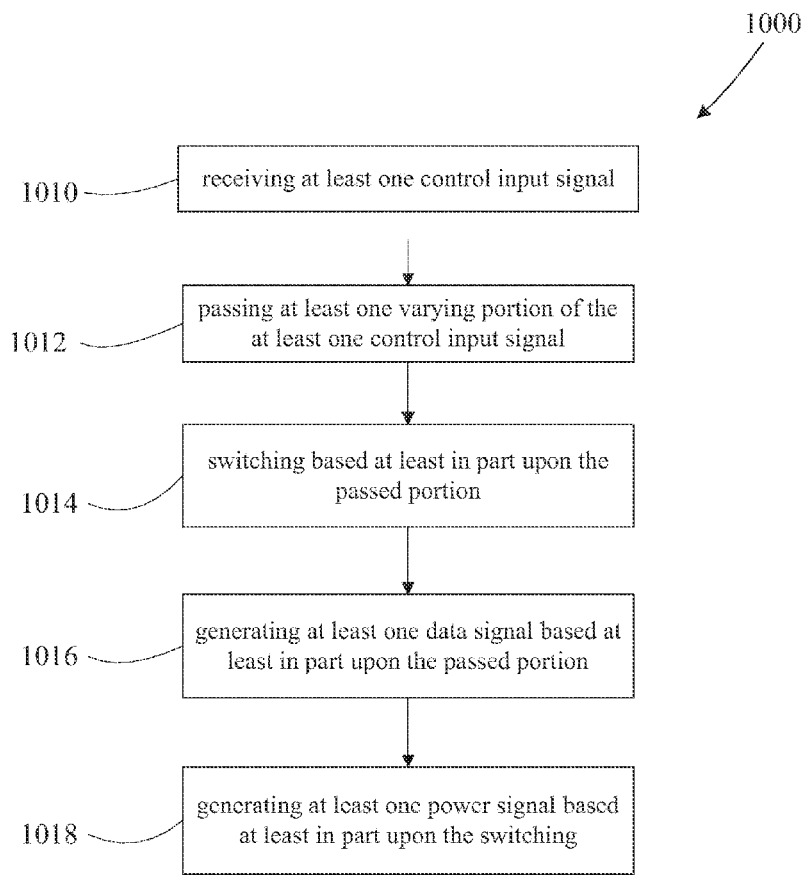
FIG. 10 shows and describes a method of galvanically isolating a switch system.

FIG. 10 indicates a method 1000 of galvanically isolating a switch system comprising the steps of, receiving 1010 at least one control input signal, passing 1012 at least one varying portion of the at least one control input signal, switching 1014 based at least in part upon the passed at least one varying portion, generating 1016 at least one data signal based at least in part upon the passed at least one varying portion and generating 1018 at least one power signal based at least in part upon the switching.

Figure 11:
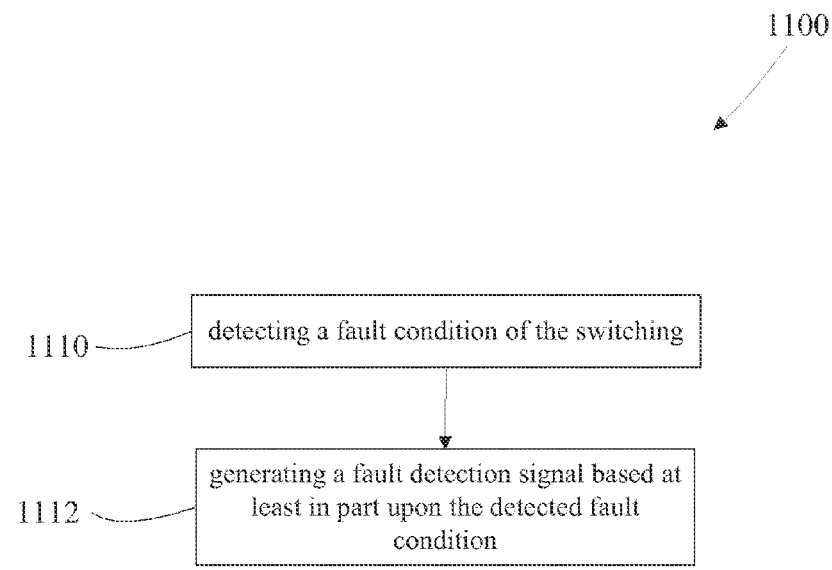
FIG. 11 depicts further steps that the method of galvanically isolating a switch system of FIG. 10 may additionally comprise.

FIG. 11 indicates that the method 1100 may further comprise the steps of detecting 1110 a fault condition of the switching and generating 1112 a fault detection signal based at least in part upon the detected fault condition.

While the making and using of various exemplary examples of the disclosure are discussed herein, it is to be appreciated that the present disclosure provides concepts which can be described in a wide variety of specific contexts. It is to be understood that the device and method may be practiced in any system having resonant tuning. For purposes of clarity, detailed descriptions of functions, components, and systems familiar to those skilled in the applicable arts are not included. While the disclosure has been described with reference to certain illustrative examples, those described herein are not intended to be construed in a limiting sense. For example, variations or combinations of steps or materials in the examples shown and described may be used in particular cases while not departing from the disclosure. Various modifications and combinations of the illustrative examples as well as other advantages and examples will be apparent to persons skilled in the arts upon reference to the drawings, description, and claims.

What is claimed is:

1. A galvanically isolated switch system comprising;
   a plurality of switches having at least one terminal in series electrical connection;
   at least one control input electrically connected to at least one of said plurality of switches, wherein said at least one control input is isolated from direct current voltages; and
   at least one passive component connected across a corresponding one of each of said plurality of switches, wherein said at least one passive component comprises at least one power capacitor.

2. The galvanically isolated switch of claim 1, further comprising at least one bleed circuit electrically connected between said at least one control input and said at least one terminal of at least one switch of said plurality of switches.

3. The galvanically isolated switch of claim 2, wherein said at least one bleed circuit comprises at least one bleed resistor.

4. The galvanically isolated switch of claim 2, wherein said at least one bleed circuit comprises at least one bleed transistor.

5. The galvanically isolated switch of claim 1, further comprising at least one communication link circuit operatively coupled to at least one of said plurality of switches.

6. The galvanically isolated switch of claim 5, wherein said at least one communication link circuit operative coupling comprises at least one of at least one wireless link and at least one wired link.

7. The galvanically isolated switch of claim 6, wherein said at least one wireless link comprises at least one of at least one magnetic coupling, at least one resonant coupling, at least one capacitive coupling and at least one resistive coupling.

8. The galvanically isolated switch of claim 1 further comprising at least one input capacitor electrically connected to said at least one control input.

9. The galvanically isolated switch of claim 1 further comprising at least one input transistor electrically connected to said at least one control input.

10. The galvanically isolated switch of claim 1, wherein at least one of said plurality of switches comprises at least one field effect transistor.

11. The galvanically isolated switch of claim 1, wherein at least one of said plurality of switches comprises at least one bipolar transistor.

12. The galvanically isolated switch of claim 1, wherein at least one of said plurality of switches comprises at least one microelectromechanical switch.

13. The galvanically isolated switch of claim 1, wherein at least one of said plurality of switches comprises at least one double pole double throw switch.

14. The galvanically isolated switch of claim 1, wherein at least one of said plurality of switches comprises at least one non-volatile memory switch.

15. The galvanically isolated switch of claim 1, wherein said at least one passive component comprises at least one leakage path.

16. The galvanically isolated switch of claim 1, wherein said at least one passive component comprises at least one power diode.

17. The galvanically isolated switch of claim 1, wherein said at least one passive component comprises at least one of at least one magnetically coupled circuit, at least one resonant circuit, at least one radio frequency circuit, at least one amplitude modulation circuit, at least one frequency modulation circuit, at least one pulsed shift key circuit and at least one on off key circuit.

18. The galvanically isolated switch of claim 1, further comprising at least one fault detection circuit responsive to at least one of said plurality of switches and providing at least one fault signal.

19. The galvanically isolated switch of claim 18 wherein said at least one fault detection circuit detects at least one current limit fault, at least one thermal fault, at least one open fault and at least one short fault.

20. The galvanically isolated switch of claim 1 wherein said at least one of said plurality of switches provides at least one power signal.

21. The galvanically isolated switch of claim 1 wherein said at least one of said plurality of switches provides at least one data signal.

22. The galvanically isolated switch of claim 1, further comprising at least one antenna responsive to at least one of said plurality of switches.

23. A galvanically isolated switch system comprising:
a plurality of switches having at least one terminal in series electrical connection;
at least one control input interface electrically connected to at least one of said plurality of switches, wherein said at least one control input is isolated from direct current voltages;
at least one passive component connected across a corresponding one of each of said plurality of switches, wherein said at least one passive component comprises at least one power capacitor;
at least one leakage path connected across said plurality of switches; and
at least one fault detection circuit responsive to at least one of said plurality of switches and providing at least one fault signal.

24. The galvanically isolated switch of claim 23 wherein said at least one of said plurality of switches provides at least one power signal.

25. The galvanically isolated switch of claim 23 wherein said at least one of said plurality of switches provides at least one data signal.

26. The galvanically isolated switch of claim 23, further comprising at least one bleed circuit electrically connected between said at least one control input and said at least one terminal of at least one switch of said plurality of switches.

27. The galvanically isolated switch of claim 23, further comprising at least one communication link circuit operatively coupled to at least one of said plurality of switches.

28. The galvanically isolated switch of claim 23, further comprising at least one fault detection circuit responsive to at least one of said plurality of switches and providing at least one fault signal.

29. A galvanically isolated switch system comprising;
a plurality of switches having at least one terminal in series electrical connection, said switches having at least one switch input;
at least one control input interface electrically connected to at least one of said plurality of switches, wherein said at least one control input is isolated from direct current voltages;
at least one power diode electrically connected across a corresponding one of each of said plurality of switches;
at least one leakage path electrically connected across said plurality of switches;
at least one rectifier diode electrically connected to said switch input;
at least one bleed resistor connected to said switch input;
at least one fault switch having at least one fault switch input and at least one fault switch output, said at least one fault switch output electrically connected to said at least one switch input; and
at least one fault detection circuit having at least one fault detection circuit input electrically connected across said switch and at least one fault detection circuit output electrically connected to said at least one fault switch input, said fault detection circuit detecting at least one of a current limit condition, an open circuit condition, a closed circuit condition and a thermal overload condition.

* * * * *